(12) United States Patent
Lin et al.

(10) Patent No.: US 8,956,966 B2
(45) Date of Patent: Feb. 17, 2015

(54) TSV STRUCTURES AND METHODS FOR FORMING THE SAME

(71) Applicant: Taiwan Semiconductor Manufacturing Company, Ltd., Hsin-Chu (TW)

(72) Inventors: Yung-Chi Lin, Su-Lin (TW); Hsin-Yu Chen, Taipei (TW); Wen-Chih Chiou, Zhunan Township (TW); Ku-Feng Yang, Baoshan Township (TW); Tsang-Jiuh Wu, Hsin-Chu (TW); Jing-Cheng Lin, Chu Tung Zhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/447,336

(22) Filed: Jul. 30, 2014

(65) Prior Publication Data

US 2014/0342547 A1 Nov. 20, 2014

Related U.S. Application Data

(62) Division of application No. 13/311,692, filed on Dec. 6, 2011, now Pat. No. 8,803,316.

(51) Int. Cl.
*H01L 21/44* (2006.01)
*H01L 21/768* (2006.01)
*H01L 23/00* (2006.01)

(52) U.S. Cl.
CPC .......... *H01L 21/76879* (2013.01); *H01L 24/11* (2013.01); *H01L 21/76885* (2013.01); *H01L 2924/01028* (2013.01); *H01L 2924/0132* (2013.01); *H01L 2924/067* (2013.01); *H01L 2924/0705* (2013.01); *H01L 2224/11011* (2013.01); *H01L 2224/13025* (2013.01)
USPC .......................................................... 438/614

(58) Field of Classification Search
CPC ........... H01L 2924/01078; H01L 2924/01079; H01L 2924/01013; H01L 2924/01029
USPC ......... 438/612–614, 629, 637, 639, 640, 667, 438/668, 672, 411, 461, 617, 675, 700, 701, 438/713, 978; 257/737–738, 774, 773, 781, 257/782, 783, 784
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |

(Continued)

*Primary Examiner* — Hoa B Trinh
(74) *Attorney, Agent, or Firm* — Slater & Matsil, L.L.P.

(57) ABSTRACT

A device includes a substrate having a front side and a backside, a through-via extending from the backside to the front side of the substrate, and a conductive pad on the backside of the substrate and over the through-via. The conductive pad has a substantially planar top surface. A conductive bump has a non-planar top surface over the substantially planar top surface and aligned to the through-via. The conductive bump and the conductive pad are formed of a same material. No interface is formed between the conductive bump and the conductive pad.

20 Claims, 14 Drawing Sheets

(56) References Cited

U.S. PATENT DOCUMENTS

| | | |
|---|---|---|
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,741,152 B2 | 6/2010 | Huang et al. |
| 7,902,643 B2 * | 3/2011 | Tuttle .............................. 257/659 |
| 2014/0284796 A1 * | 9/2014 | Hiatt et al. .................... 257/738 |

* cited by examiner

TSV STRUCTURES AND METHODS FOR FORMING THE SAME

This application is a divisional of U.S. Ser. No. 13/311,692, filed Dec. 6, 2011, entitled "TSV Structures and Methods for Forming the Same," which application is hereby incorporated herein by reference.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially Two-Dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, Three-Dimensional Integrated Circuit (3DIC) and stacked dies are commonly used. Through-Silicon Vias (TSVs) are thus used in 3DIC and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film. Interconnect structures and connectors are formed on the backside of the semiconductor substrates in order to connect to the features on the front side.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for forming backside interconnect structures that are connected to through-substrate vias (TSVs) is provided in accordance with various embodiments. The intermediate stages of manufacturing the backside interconnect structures are illustrated. The variations of the embodiments are discussed. Throughout the various views and illustrative embodiments, like reference numbers are used to designate like elements. It is appreciated that FIGS. 1 through 17 and the corresponding description of the structures and methods are merely embodiments.

Figure 1:
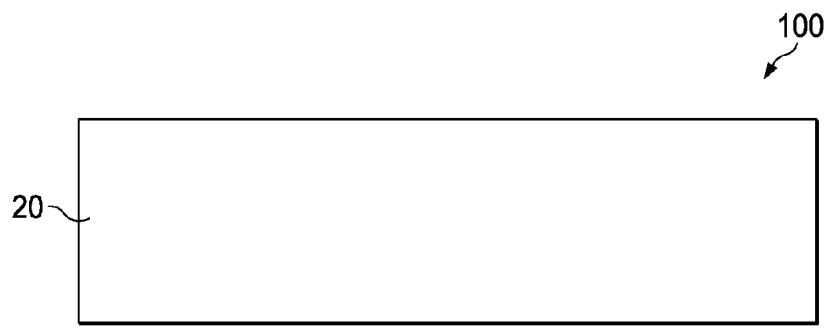
FIGS. 1 through 11 are cross-sectional views of intermediate stages in the manufacturing of a device in accordance with various exemplary embodiments, wherein Through-Substrate Vias (TSVs) are formed in a substrate, and wherein a backside interconnect structure comprising a bump is formed on the backside of the substrate.

FIGS. 1 through 11 are cross-sectional views of intermediate stages in the manufacturing of a device in accordance with various exemplary embodiments. Referring to FIG. 1, wafer 100, which includes semiconductor substrate 20, is provided. Semiconductor substrate 20 may be formed of silicon, silicon germanium, silicon carbon, III-V compound semiconductor materials, or the like.

Figure 2A:
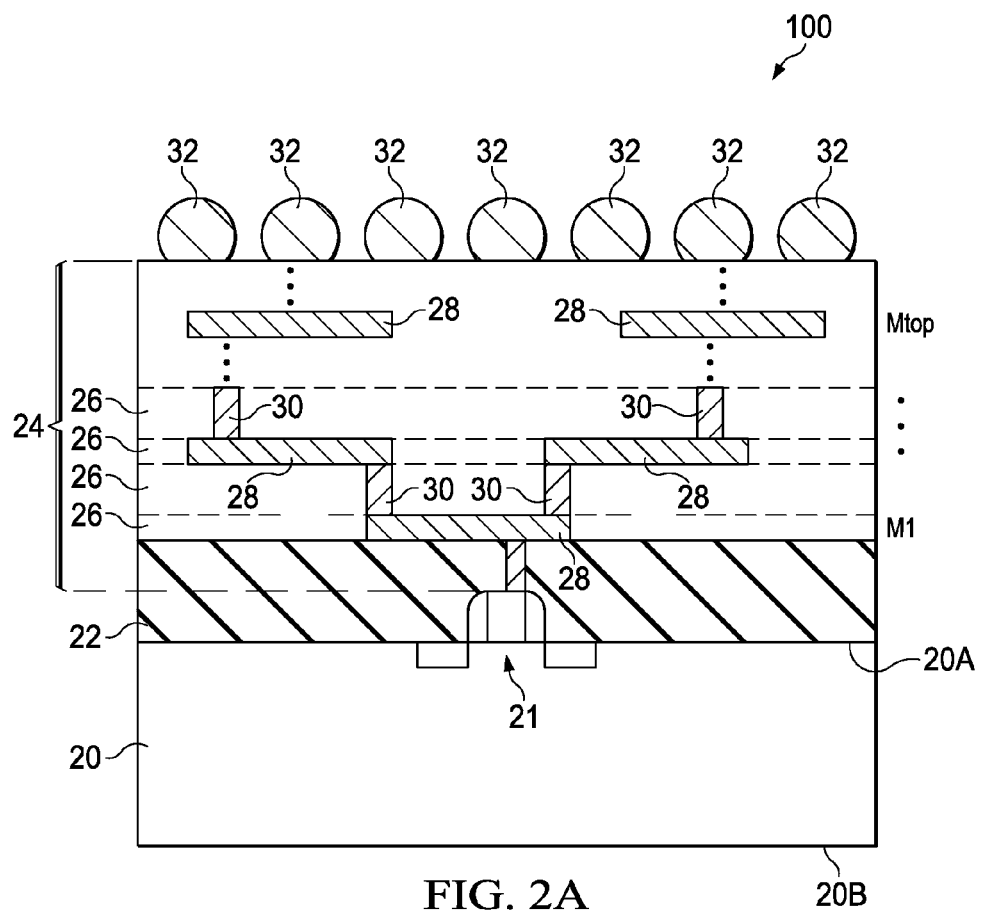
Figure 2B:
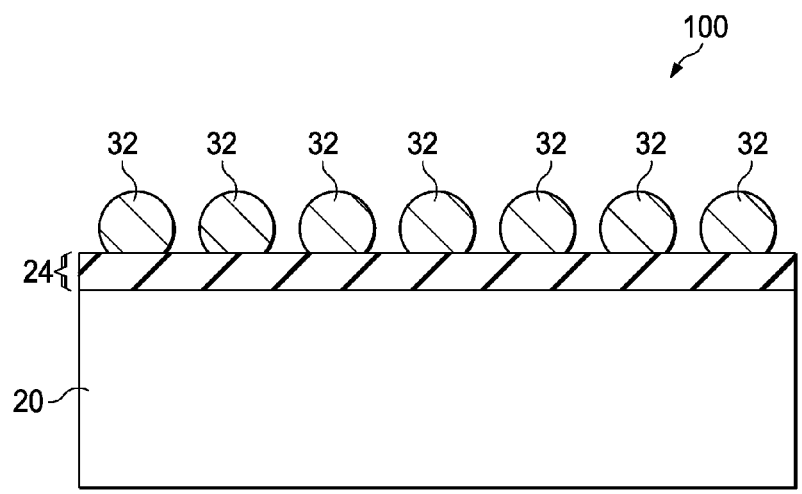

Referring to FIG. 2A, integrated circuit devices 21 and front-side interconnect structure 24 are formed on the front side of substrate 20. Integrated circuit devices 21 such as Complementary Metal-Oxide-Semiconductor (CMOS) devices are formed on front surface 20A of semiconductor substrate 20, and are symbolized by a transistor. Inter-Layer Dielectric (ILD) 22 is formed over integrated circuit devices 21. ILD 22 belongs to interconnect structure 24, which further includes dielectric layers 26, and metal lines 28 and vias 30 in dielectric layers 26. Interconnect structure 24 may include bottom metal layer M1 through top metal layer Mtop. Metal layer M1 is also the first metal layer over integrated circuit devices 21. In an embodiment, dielectric layers 26 are formed of low-k dielectric materials. The dielectric constants (k values) of the low-k dielectric materials may be less than about 3.0, or less than about 2.5, for example. Metal lines 28 and vias 30 may be formed of copper or copper alloys, although they can also be formed of other metals. One skilled in the art will realize the formation details of the metal layers.

Connectors 32 are formed on the top surface of wafer 100. Connectors 32 may be solder balls, metal pads, metal pillars, and combinations thereof. Between connectors 32 and front-side interconnect structure 24, there may be additional features such as metal pads, passivation layers, under-bump metallurgies, polymer layers, which are not illustrated. In the following illustrated embodiments, the front side structure as in FIG. 2A may be simplified using the scheme shown in FIG. 2B, while the details as in FIG. 2A may not be shown.

Figure 3A:
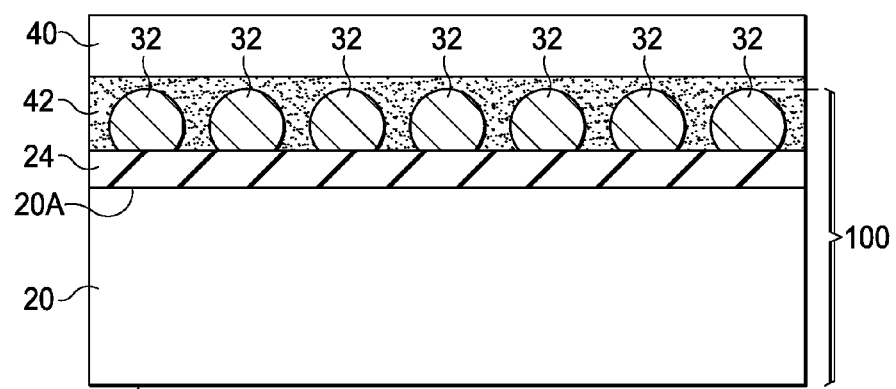
Figure 3B:
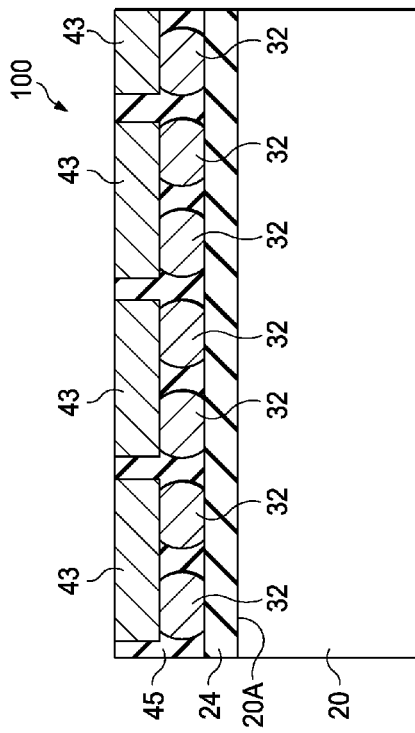

Referring to FIG. 3A, wafer 100 is mounted on carrier 40, for example, through adhesive 42, wherein the front side of wafer 100 faces carrier 40. Back surface 20B of substrate 20 is exposed. FIG. 3B illustrates backside interconnect structures in accordance with alternative embodiments, wherein dies 43 are bonded to wafer 100 through connectors 32. Again, back surface 20B of substrate 20 is exposed. Molding compound 45 may be used to mold wafer 100. Dies 43 are molded in molding compound 45.

Figure 4:
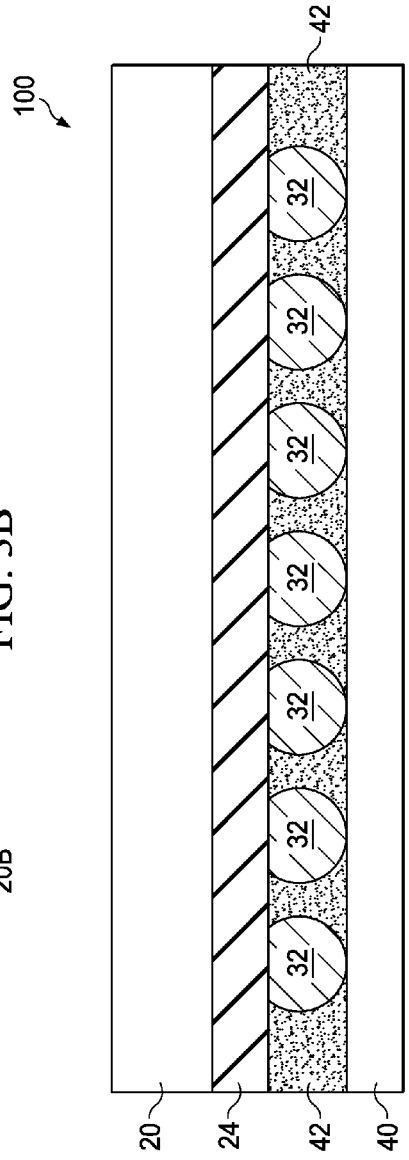
Figure 5A:
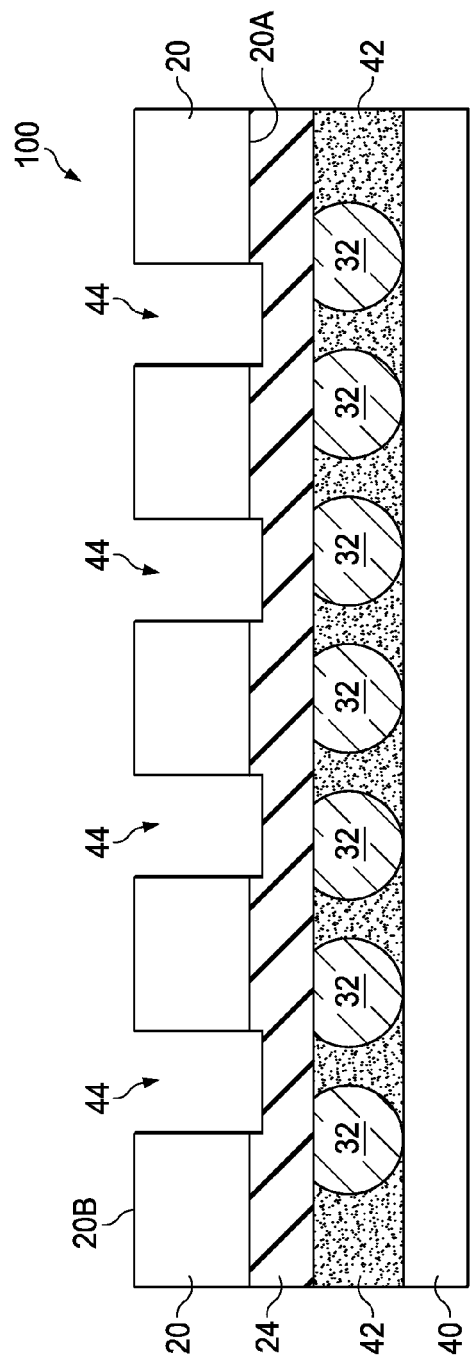
Figure 5B:
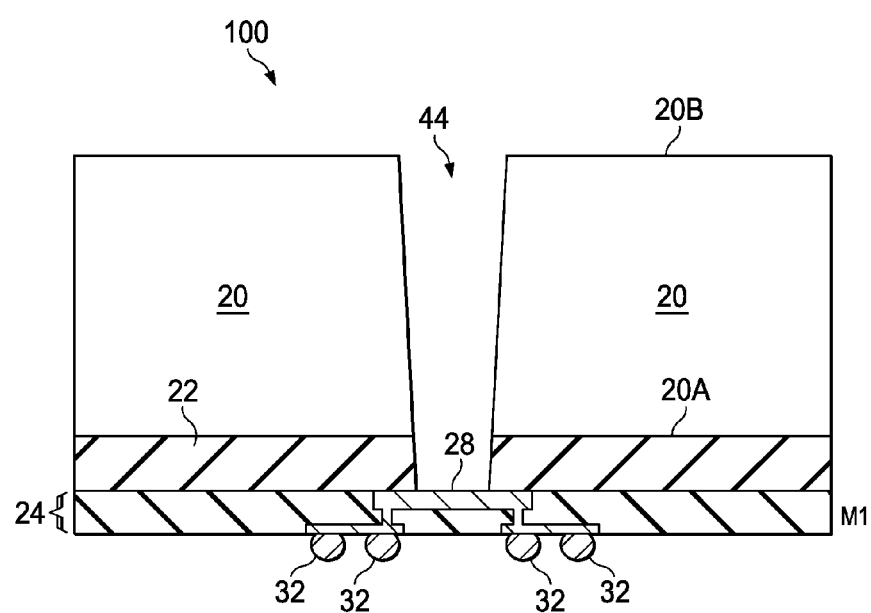

In FIG. 4, a wafer thinning is performed from the backside of substrate 20, so that the thickness of substrate 20 is reduced to a desirable value. Next, as shown in FIG. 5A, lithography and etch processes are performed to form openings 44, through which the conductive features on the front side of substrate 20 are exposed. Openings 44 are referred to as TSV openings hereinafter. FIG. 5B illustrates a portion of the structure in FIG. 5A in accordance with an exemplary embodiment, wherein metal line/pad 28 in metal layer M1 is exposed through TSV opening 44. TSV opening 44 thus penetrates through substrate 20 and optionally ILD 22. In alternative embodiments, the metal pads in other metal layers other than M1 may be exposed through TSV openings 44.

Figure 6:
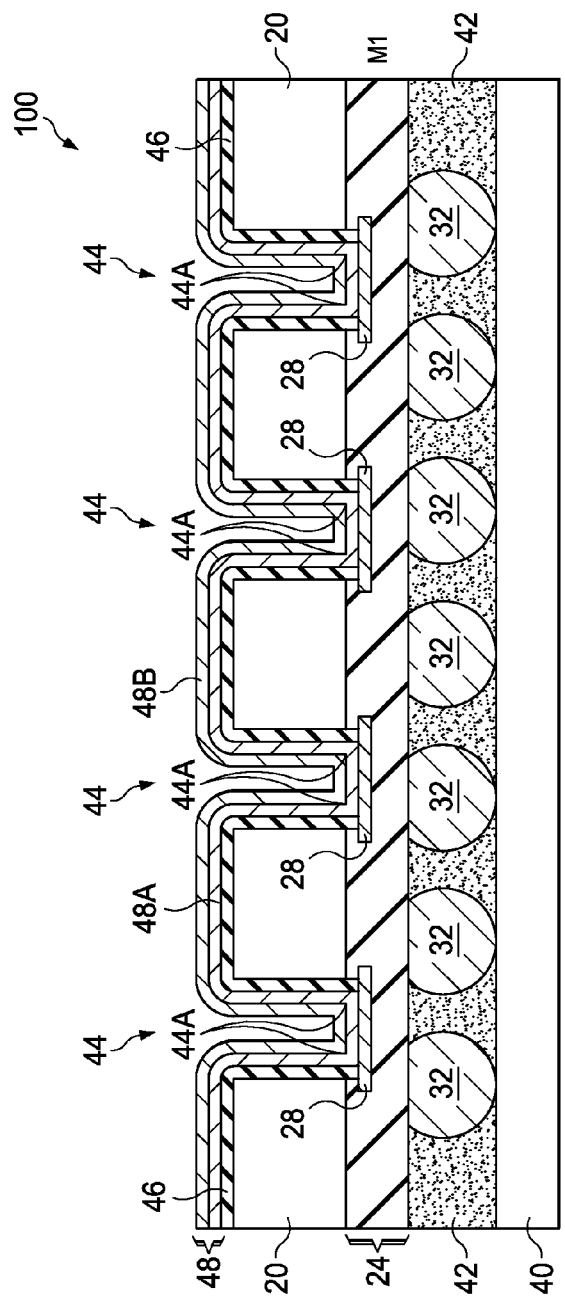

Referring to FIG. 6, liner 46 is formed and patterned, so that the sidewalls of TSV openings 44 and the back surface 20B of substrate 20 are covered, while portions of liner 46 at the bottom of openings 44 are removed. Liner 46 is formed of a dielectric material. In some embodiments, liner 46 is formed of a photo-sensitive material such as an epoxy. In alternative embodiments, liner 46 is formed of other dielectric materials such as silicon oxide, silicon nitride, or the like. After the patterning of liner 46, composite pre-layer 48 is formed. Composite pre-layer 48 may comprise barrier layer 48A and seed layer 48B over barrier layer 48A. In some embodiments, barrier layer 48A may comprise titanium, titanium nitride, tantalum, tantalum nitride, and the like. Seed layer 48B may comprise copper, for example. In some embodiments, UBM layer 48 is formed using Physical Vapor Deposition (PVD). In exemplary embodiments, barrier layer 48A may have a thickness between about 0.01 µm and about 1.0 µm. Seed layer 48B may have a thickness between about 0.1 µm and about 2.0 µm. It is realized, however, that the dimensions recited throughout the description are merely examples, and may be changed to different values.

Figure 7:
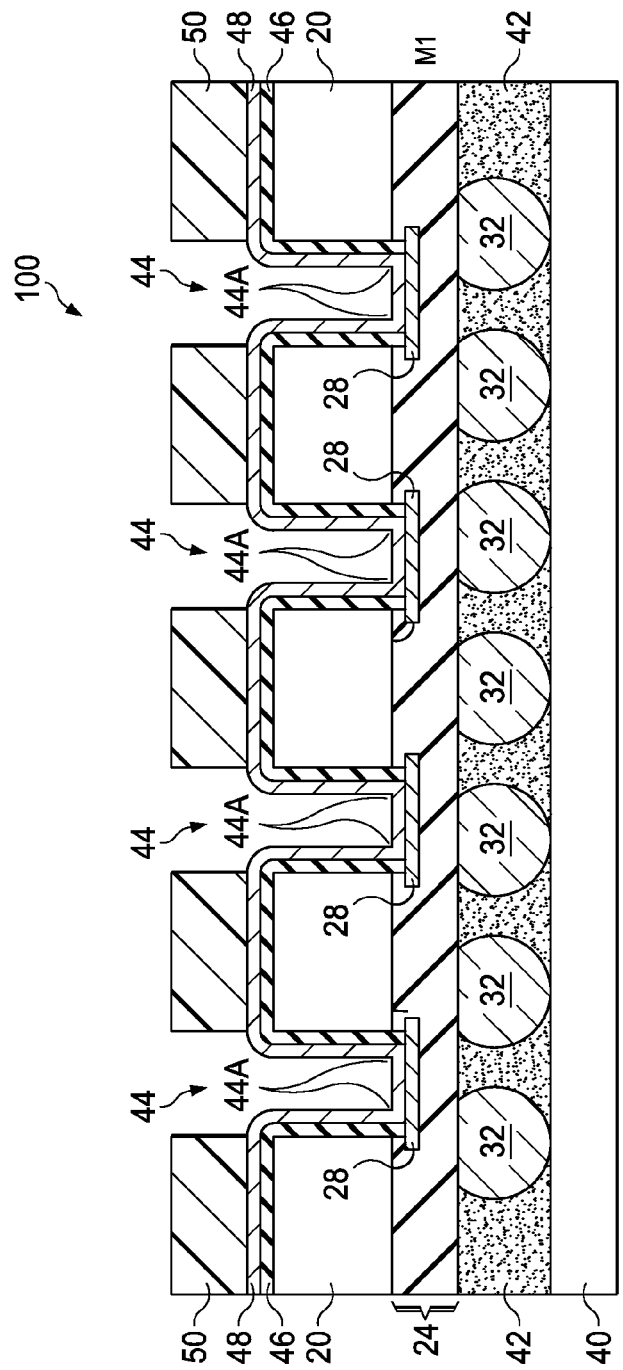
Figure 8:
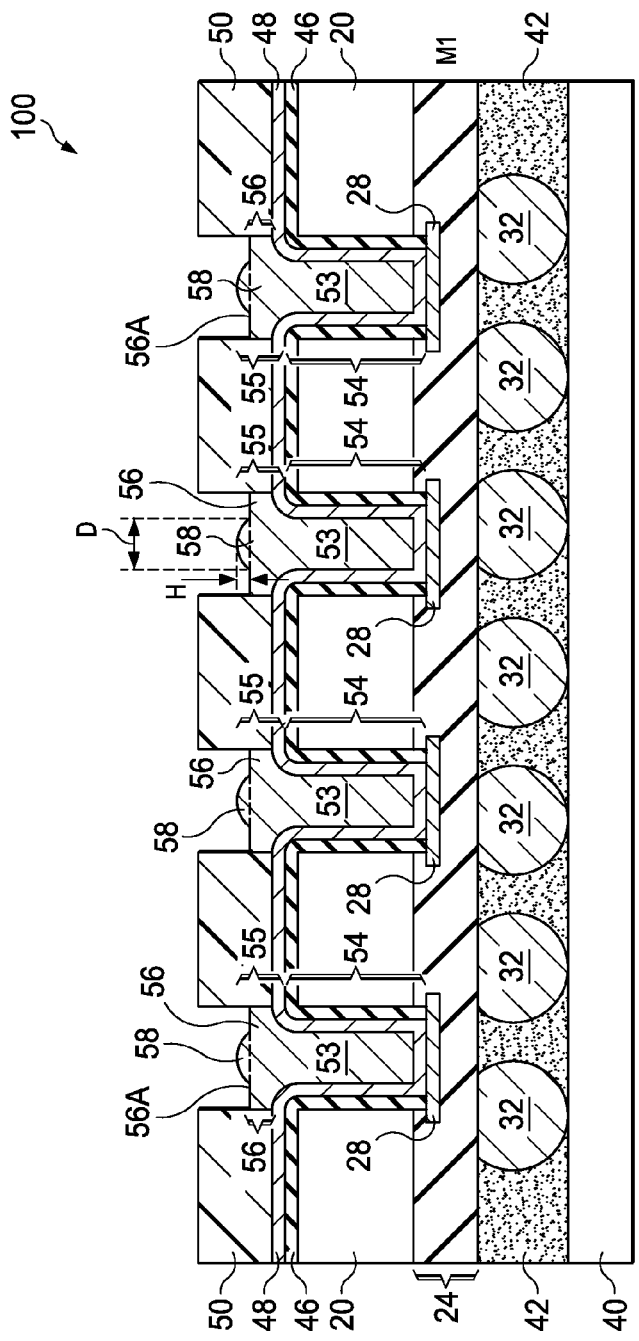

Referring to FIG. 7, mask 50 is formed to partially mask the backside of wafer 100, wherein openings 44 are exposed through the openings in mask 50. Mask 50 may be formed of a dry film, which is laminated on wafer 100 and then patterned. Alternatively, mask 50 may be formed of a photo resist. FIG. 8 illustrates the formation of TSVs 54 and backside connectors 55, which comprises filling conductive material 53 into openings 44 (please refer to FIG. 7). Conductive material 53 may comprise copper or a copper alloy, although other metals such as aluminum, tungsten, and/or the like may also be used. Accordingly, the lower portions of conductive material 53 form portions of TSVs 54, and the upper portions of the conductive form portions of backside connectors 55. TSV 54 comprises conductive material 53 and the corresponding underlying portions of composite pre-layer 48. Connectors 55 also comprise conductive material 53 and the corresponding underlying portions of composite pre-layer 48. In an embodiment, conductive material 53 is formed using Electro-Chemical Plating (ECP), although other plating methods may be used. Throughout the description, the parts of composite pre-layer 48 in TSV openings 44 are considered as parts of the respective TSVs 54.

The ECP may be performed using a plating solution comprising bis(3-sulfopropyl)disulfide (SPS) as an accelerator, and polyethylene glycol (PEG) as a suppressor, although other accelerators and suppressors may be used. In some exemplary ECP processes, the exemplary concentration of the SPS is between about 0.0001 weight percent and about 0.001 weight percent, the exemplary concentration of the PEG being between about 0.0001 weight percent and about 0.001 weight percent. The plating may be performed with the plating solution being at a temperature between about 10° C. and about 50° C. The duration of the ECP may be between about 10 minutes and about 4 hours. By using the appropriate accelerator and suppressor with appropriate concentrations, the accelerator may be accumulated at corners 44A (please refer to FIG. 7) of through-via openings 44, while the sidewalls and the bottoms of openings 44 are dominated by the suppressor. Accordingly, there is more plating occurring at corners 44A, while the plating on the sidewalls and the bottoms of openings 44 is suppressed. Accordingly, a planar bottom-up plating may occur, and corners 44A continue to have a greater plating rate than other portions. As a result, as shown in FIG. 8, connectors 55 are formed over TSVs 54.

In the structure as shown in FIG. 8, connectors 55 include metal pads 56 and bumps 58 over metal pads 56. Metal pads 56 are the portions of connectors 55 that have substantially planar top surfaces 56A, while bumps 58 are the portions of connectors 55 that are over the substantially planar top surfaces 56A. In some embodiments, bumps 58 have smoothly curved top surfaces. The curved top surfaces of bumps 58 may also be substantially rounded. The top-view shape of bumps 58 may be circles, ellipses, and the like. The heights H of bumps 58 may be greater than about 0.1 µm, and may be between about 0.1 µm and about 10 µm in some exemplary embodiments. The lateral dimension D of bumps 58 may be depended on the CD of TSV, and may be between about 2.0 µm and about 30 µm in some exemplary embodiments. When the top-view shapes of bumps 58 are rounded, the lateral dimension D is a diameter. Bumps 58 and metal pad 56 are formed in a same formation process, and are formed of a same material. Therefore, there are no visible interfaces between bumps 58 and metal pads 56, and each of bumps 58 forms a continuous region with the underlying metal pad 56. At least portions, and may be entireties, of bumps 58 are aligned to the corresponding TSVs 54. Metal pads 56 comprise portions that do not overlap TSVs 54, which portions have planar top surfaces 56A.

Figure 9:
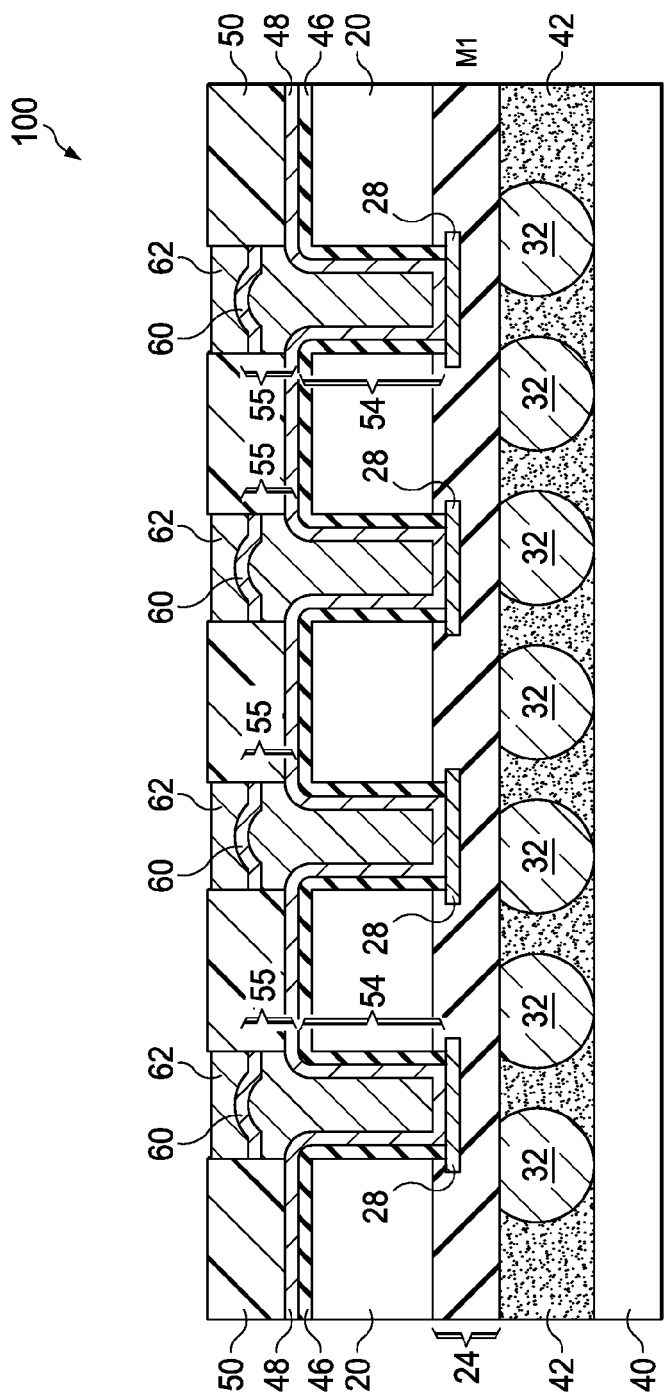
Figure 10:
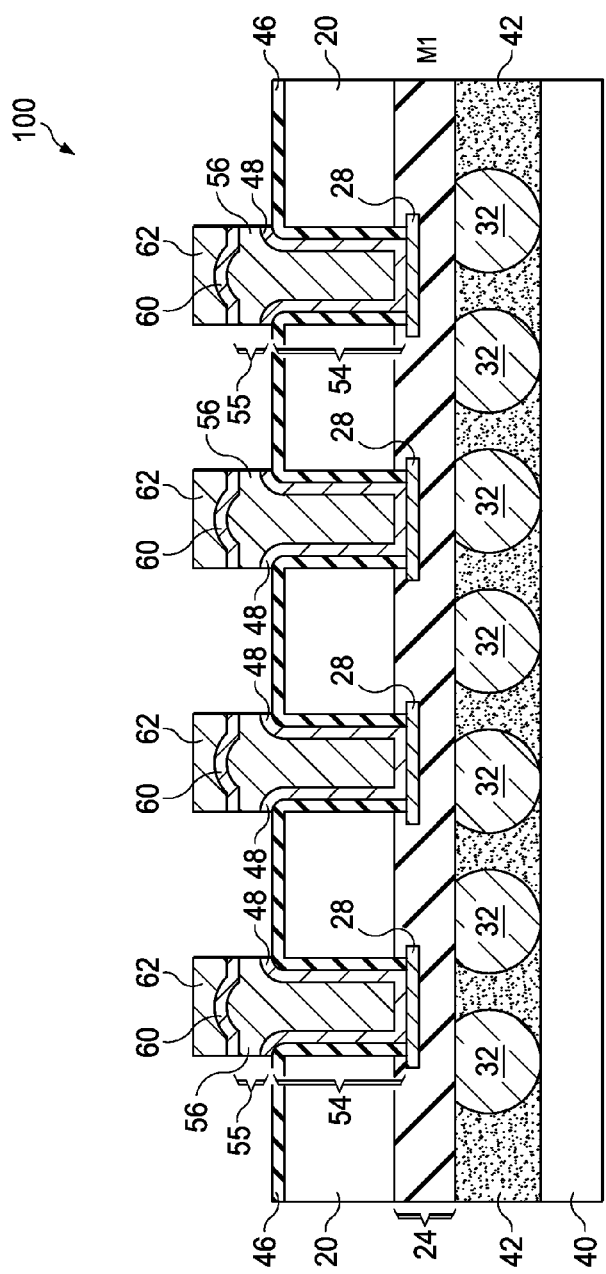
Figure 11:
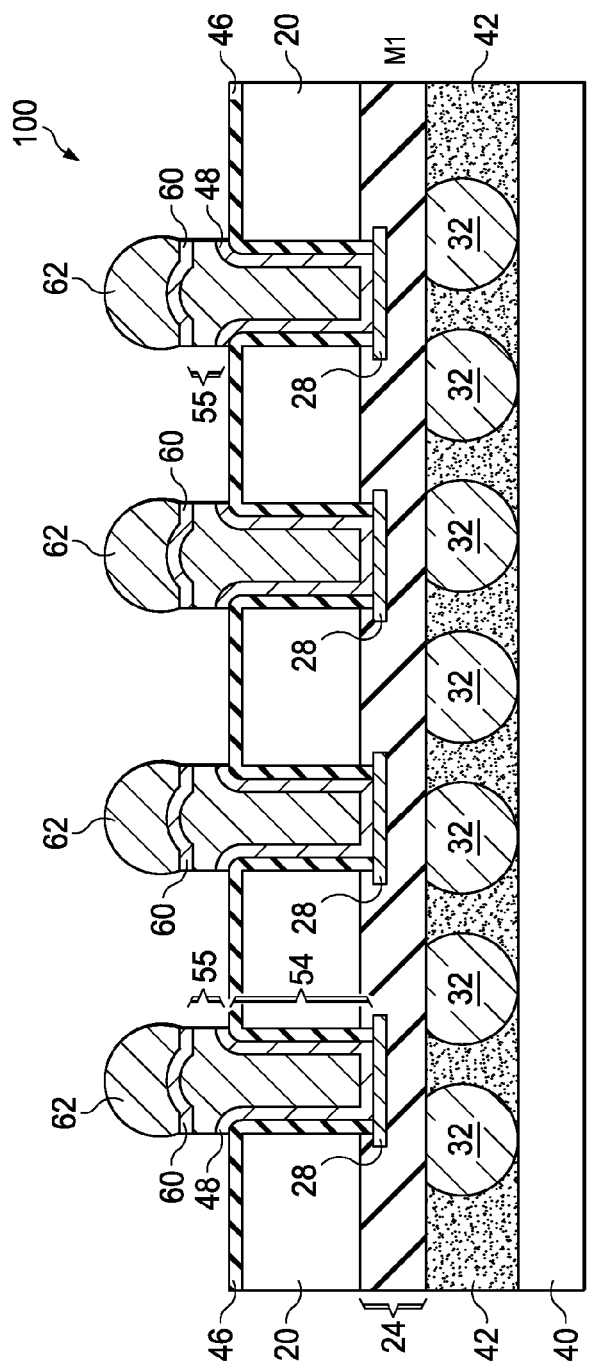

Referring to FIG. 9, optional under-bump metallurgies (UBMs) 60 and solder regions 62 are plated. UBMs 60 may comprise nickel, although other metallic material such as palladium, gold, or the like, may also be used. In subsequent steps, as shown in FIG. 10, mask 50 and the portions of composite pre-layer 48 that overlap mask 50 are removed. Next, as shown in FIG. 11, a reflow is performed, so that solder regions 62 form solder balls, which are also denoted using reference numeral 62. In some exemplary embodiments, UBMs 60 may have a thickness between about 1.0 µm and about 5.0 µm. Solder regions 62 may have a thickness between about 15 µm and about 80 µm. In subsequent steps, carrier 40 may be demounted from wafer 100, and a die saw step may be performed to saw apart the dies in wafer 100.

FIGS. 12 through 17 illustrate magnified views of the backside interconnect structures in accordance with various exemplary embodiments. Unless specified otherwise, connectors 55, TSVs 54, and the front side interconnect structures in each of FIGS. 12 through 17 may be similar to the corresponding features in other ones of FIGS. 12 through 17, and may be similar to what are shown in FIG. 11. Composite pre-layer 48 as in FIG. 11 is not illustrated since it is considered as a part of the respective TSV 54. Furthermore, although solder regions 62 are shown as solder balls, solder regions 62 may also be solder caps that are not reflowed (similar to what are shown in FIG. 10), and hence do not have a ball shape. In each of FIGS. 12 through 17, metal bumps 58 may have round top surfaces that are smoothly connected to substantially planar top surfaces 56A of the respective metal pads 56. Metal bumps 58 and the underlying metal pads 56 actually form integrated regions, with no visible interfaces therebetween. Furthermore, in each of FIGS. 12 through 17, solder region 62 has a bottom surface that includes a central portion, and planar edge portions, wherein the central portion has a concave shape, and is higher than the planar edge portions.

Figure 12:
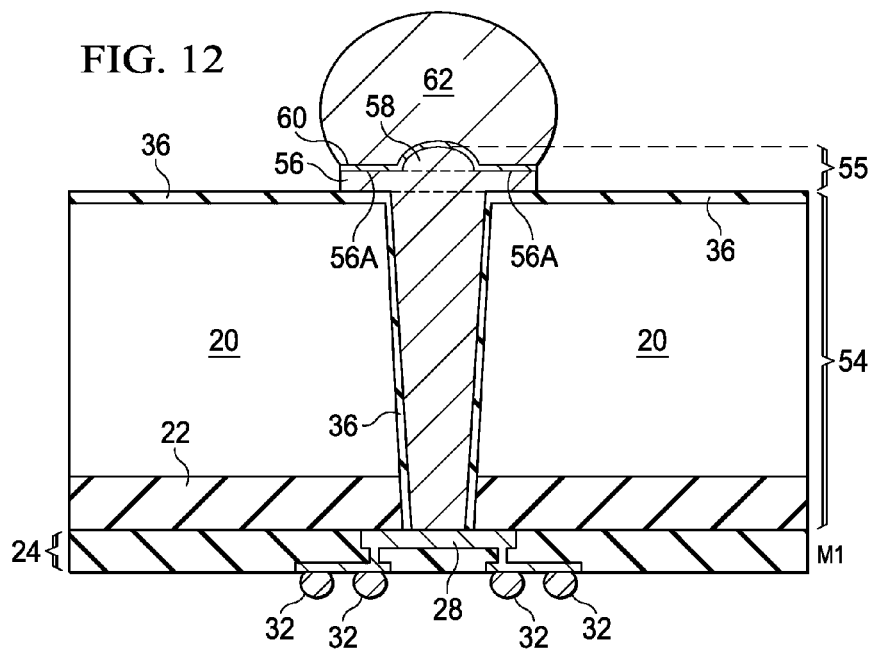
FIGS. 12 through 17 illustrate backside interconnect structures that are connected to the TSVs in accordance with alternative exemplary embodiments.

Referring to FIG. 12, UBM 60 is formed on, and may be in physical contact with, metal bump 58 and metal pad 56. Accordingly, UBM 60 also comprises a central portion higher than edge portions, wherein the central portion is directly over and aligned to metal bump 58, while the edge portions are directly over the edge portions of metal pad 56. Solder region 62 is formed on, and may be in contact with, UBM 60.

Figure 13:
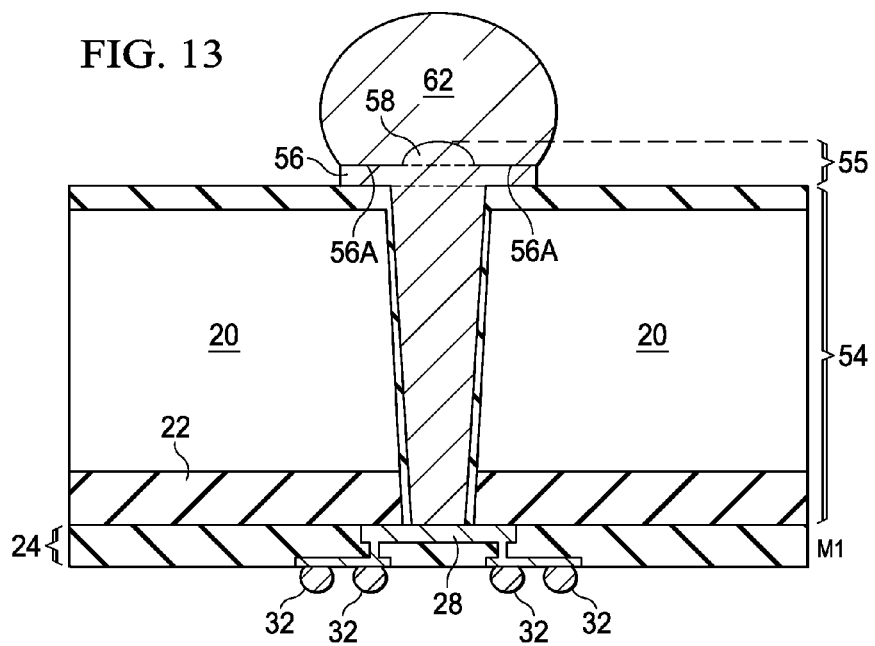

FIG. 13 illustrates the backside interconnect structure in accordance with alternative embodiments, wherein no UBM is formed, and solder region 62 is over and in contact with metal bump 58 and metal pad 56.

Figure 14:
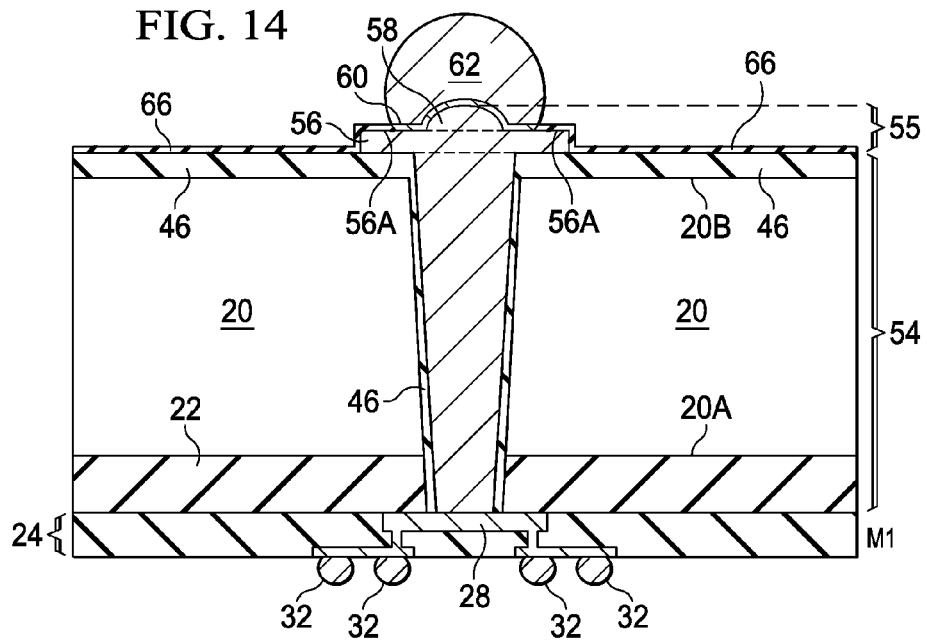

FIG. 14 illustrates the backside interconnect structure in accordance with alternative embodiments, wherein passivation layer 66 is formed to cover the edge portions and the sidewalls of metal pad 56. Passivation layer 66 also extends on the remaining portions of liner 46 that are on back surface 20B of substrate 20. Passivation layer 66 may be formed of silicon oxide, silicon nitride, and multi-layers thereof. Alternatively, passivation layer 66 may be formed of phospho-silicate glass (PSG), boro-silicate glass (BSG), boron-doped phospho-silicate glass (BPSG), or the like. An opening is formed in passivation layer 66, so that metal bump 58 and some portions of metal pad 56 are exposed. UBM 60 may be formed in the opening in passivation layer 66, and in contact with metal bump 58 and metal pad 56. Similarly, UBM 60 may also comprise first portions that are planar and contacting the top surface of metal pad 56, and a second portion that is higher than the first portions. The second portion may also have a round profile, and have a round top surface. By forming this structure, the size of UBM 60 and solder region 62 may be limited.

Figure 15:
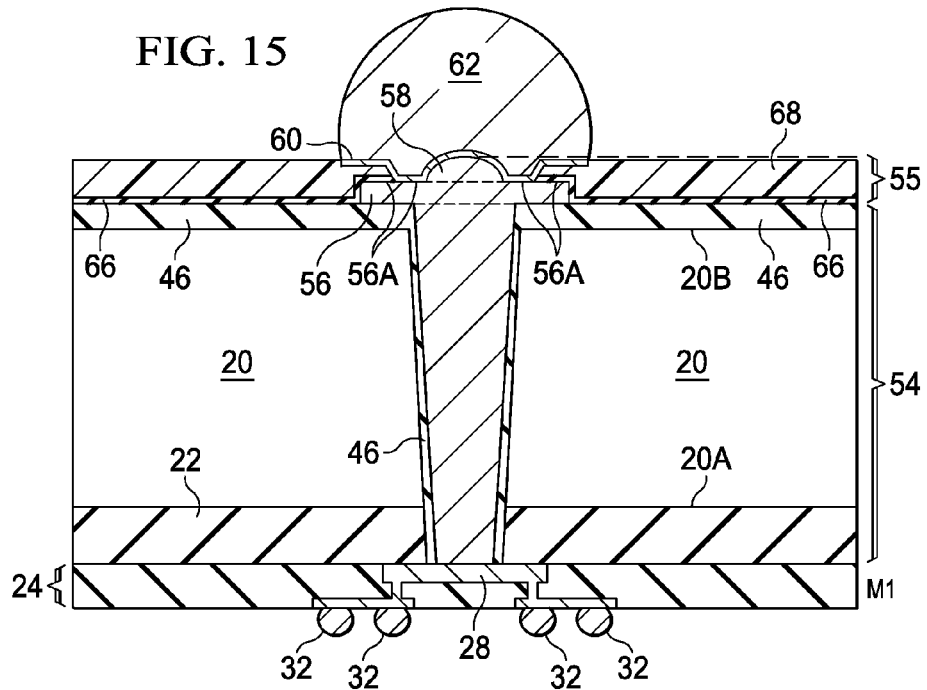

FIG. 15 illustrates backside interconnect structures in accordance with alternative embodiments, wherein stress buffer layer 68 is formed to cover passivation layer 66. Stress buffer layer 68 may be formed of a polymer such as polyimide. Furthermore, stress buffer layer 68 may be formed of a photo-sensitive material. Accordingly, stress buffer layer 68 may also be used as the photo resist for patterning passivation layer 66, and for exposing metal bump 58 and metal pad 56. UBM 60 may be in contact with metal bump 58 and metal pad 56, and extend to over and aligned to the edge portions of stress buffer layer 68.

Figure 16:
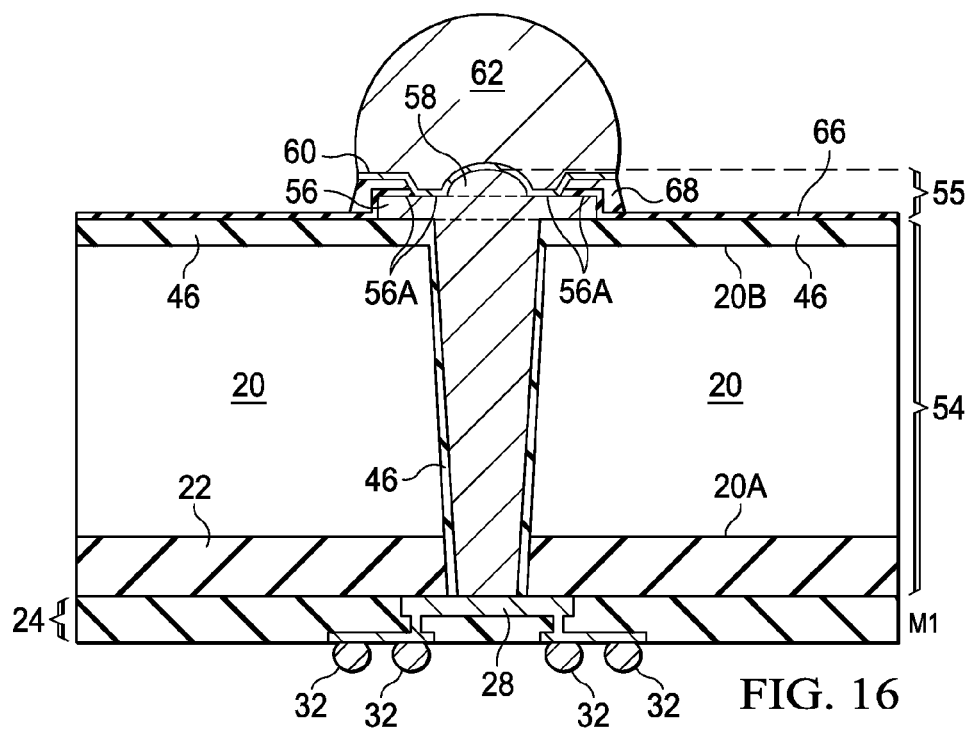

FIG. 16 illustrates backside interconnect structures in accordance with alternative embodiments, wherein stress buffer layer 68 is formed to cover passivation layer 66. These embodiments are similar to the embodiments in FIG. 15, except an additional patterning step may be performed to remove portions of the stress buffer layer 68 that are not covered by UBM 60 and solder region 62. The remaining portions of stress buffer layer 68 are thus underlying and aligned to solder region 62.

Figure 17:
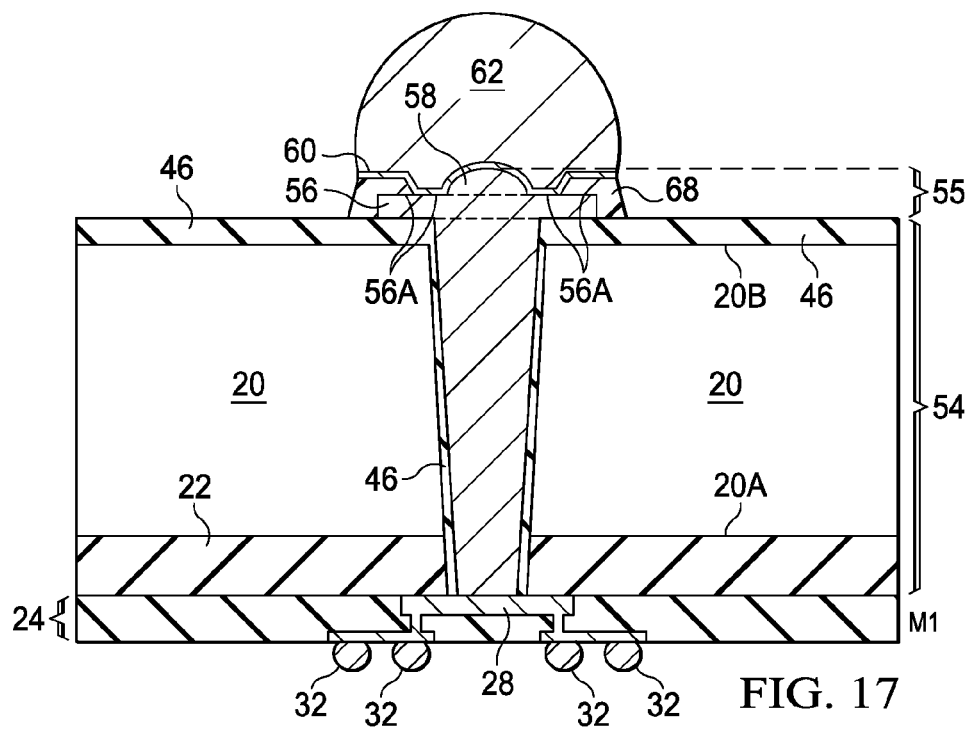

FIG. 17 illustrates backside interconnect structures in accordance with alternative embodiments, wherein stress buffer layer 68 is formed to cover passivation layer 66. These embodiments are similar to the embodiments in FIGS. 15 and 16, except that passivation layer 66 is not formed, and additional patterning steps may be performed to remove portions of stress buffer layer 68 that are not covered by UBM 60 and solder region 62. As a result, the remaining portions of stress buffer layer 68 are underlying and aligned to solder region 62.

In the embodiments, with the formation of metal bumps 58, the interface areas between metal connectors 55 and overlying features such as UBMs 60 and solder regions 62 are increased. The area of the inter-metallic compound that is formed between connectors 55 and the overlying features is increased. Furthermore, the top surfaces of connectors 55 are not planar. Accordingly, the shear strength of connectors 55 and solder regions 62 is improved.

In accordance with embodiments, a device includes a substrate having a front side and a backside, a through-via extending from the backside to the front side of the substrate, and a conductive pad on the backside of the substrate and over the through-via. The conductive pad has a substantially planar top surface. A conductive bump has a non-planar top surface over the substantially planar top surface and aligned to the through-via. The conductive bump and the conductive pad are formed of a same material. No interface is formed between the conductive bump and the conductive pad.

In accordance with other embodiments, a device includes a semiconductor substrate having a front side and a backside. A through-via extends from the backside to the front side of the semiconductor substrate. A metal connector is disposed on the backside of the semiconductor substrate and over the through-via, wherein the metal connector includes a substantially planar top surface, and a non-planar top surface smoothly connected to the substantially planar top surface. A metal feature is over and in contact with the substantially planar top surface and the non-planar top surface of the metal connector. The metal feature and the metal connector comprise different materials.

In accordance with yet other embodiments, a method includes forming a first opening from a backside of a substrate, wherein the first opening extends to a front side of the substrate. The first opening is filled with a conductive material to form a through-via in the first opening, until a portion of the conductive material outside the first opening forms a connector over the substrate and on the backside of the substrate. The connector includes a substantially planar top surface, and a non-planar top surface smoothly connected to the substantially planar top surface, wherein the non-planar top surface is higher than the planar top surface. A metal feature is formed over and in contact with the substantially planar top surface and the non-planar top surface of the connector, wherein the metal feature and the connector comprise different materials.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first opening from a backside of a substrate, wherein the first opening extends to a front side of the substrate;
   filling the first opening with a conductive material to form a through-via in the first opening, until a portion of the conductive material outside the first opening forms a connector over the substrate and on the backside of the substrate, wherein the connector comprises:
      a substantially planar top surface; and
      a non-planar top surface smoothly connected to the substantially planar top surface, wherein the non-planar top surface is higher than the planar top surface; and
   forming a metal feature over and in contact with the substantially planar top surface and the non-planar top surface of the connector, wherein the metal feature and the connector comprise different materials.

2. The method of claim 1, wherein filling the first opening and forming the metal feature comprise electro-chemical plating, and wherein a same mask is used for filling the first opening and forming the metal feature, with the connector and the metal feature plated through an opening in the mask.

3. The method of claim 1, wherein forming the metal feature comprises:
   plating a nickel-containing layer on the connector, wherein the nickel-containing layer comprises a non-planar portion aligned to the through-via, and a planar portion not aligned to the through-via; and
   plating a solder region over the nickel-containing layer, wherein the solder region comprises a non-planar bottom surface aligned to the through-via, and a planar bottom surface portion not aligned to the through-via.

4. The method of claim 1 further comprising forming a passivation layer on the backside of the substrate and covering an edge portion of the connector, wherein the metal feature penetrates through the passivation layer.

5. The method of claim 4 further comprising forming a stress buffer layer on the backside of the substrate and covering a portion of the passivation layer and the edge portion of the connector, wherein the metal feature further penetrates through the stress buffer layer.

6. The method of claim 1, wherein filling the first opening and forming the metal feature are performed using electro-chemical plating, and wherein the electro-chemical plating comprises using a plating solution comprising bis(3-sulfopropyl)disulfide (SPS) as an accelerator and polyethylene glycol (PEG) as a suppressor.

7. The method of claim 6, wherein the plating solution comprises a first concentration of SPS and a second concentration of PEG, wherein the first concentration is between about 0.0001 weight percent and about 0.001 weight percent, and wherein the second concentration is between about 0.0001 weight percent and about 0.001 weight percent.

8. A method comprising:
   patterning a first opening extending through a substrate;
   forming a patterned mask on a backside of the substrate, wherein the patterned mask comprises a second opening aligned with the first opening;
   filling the first opening and at least a portion of the second opening with a conductive material, wherein a lateral surface of the conductive material in the second opening comprises:
      a substantially planar portion; and
      a non-planar portion connected to the substantially planar portion;
   forming a metal feature at least partially in the second opening, wherein the metal feature covers the lateral surface of the conductive material; and
   removing the patterned mask.

9. The method of claim 8, wherein forming the metal feature comprises:
   forming a under bump metallurgy (UBM) layer on the lateral surface of the conductive material; and
   forming a solder region on the UBM layer.

10. The method of claim 8, wherein the metal feature and the conductive material comprise different materials.

11. The method of claim 8 further comprising forming a passivation layer on the backside of the substrate, wherein the passivation layer covers edges of the lateral surface of the conductive material.

12. The method of claim 8 further comprising forming a stress buffer layer on the backside of the substrate, wherein the conductive material extends through the stress buffer layer, and wherein the metal feature at least partially covers the stress buffer layer.

13. The method of claim 12 further comprising removing portions of the stress buffer layer not covered by the metal feature.

14. The method of claim 12 further comprising forming a passivation layer between the stress buffer layer and substrate.

15. The method of claim 8 further comprising prior to filling the first opening and at least the portion of the second opening with the conductive material, forming a composite pre-layer on a sidewall and a bottom surface of the first opening, wherein the composite pre-layer comprises:
   a barrier layer; and
   a conductive seed layer over the barrier layer.

16. A method comprising:
   forming a conductive via extending through a substrate;
   forming a first conductive feature on a backside of the substrate and aligned with the conductive via, wherein the first conductive feature comprises:
      a first portion comprising a substantially planar top surface relative the backside of the substrate; and
      a second portion comprising a non-planar top surface relative the backside of the substrate; and
   forming a second conductive feature over and contacting the first conductive feature relative the backside of the substrate, wherein the first and the second conductive features comprise different materials.

17. The method of claim 16, wherein the conductive via and the first conductive feature comprise a same material, and wherein forming the conductive via and forming the first conductive feature comprises using a single electro-chemical plating process.

18. The method of claim 16, wherein the electro-chemical plating process comprises using a plating solution comprising a first concentration of an accelerator and a second concentration of a suppressor, wherein the first concentration is between about 0.0001 weight percent and about 0.001 weight percent, and wherein the second concentration is between about 0.0001 weight percent and about 0.001 weight percent.

19. The method of claim 18, further comprising:
   using bis(3-sulfopropyl)disulfide (SPS) as the accelerator; and
   using polyethylene glycol (PEG) as the suppressor.

20. The method of claim 16, wherein forming the second conductive feature comprises:
   plating a under bump metallurgy (UBM) layer on first conductive feature, wherein the UBM layer comprises a non-planar portion aligned with the conductive via, and a planar portion not aligned with the conductive via; and
   plating a solder region over the UBM layer.

* * * * *